(12) United States Patent
Miura

(10) Patent No.: US 7,345,337 B2
(45) Date of Patent: Mar. 18, 2008

(54) SEMICONDUCTOR APPARATUS HAVING A DIVIDED COLUMN REGION

(75) Inventor: Yoshinao Miura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/017,754

(22) Filed: Dec. 22, 2004

(65) Prior Publication Data
US 2005/0139909 A1 Jun. 30, 2005

(30) Foreign Application Priority Data
Dec. 25, 2003 (JP) ............................. 2003-430603

(51) Int. Cl.
*H01L 27/108* (2006.01)
(52) U.S. Cl. .................. 257/330; 257/327; 257/328; 257/329; 257/331
(58) Field of Classification Search ............... 257/330, 257/331, 332, 328, E29.201, E29.26, 327, 257/329, 333
See application file for complete search history.

(56) References Cited

U.S. PATENT DOCUMENTS

| | | | |
|---|---|---|---|
| 6,633,064 B2 | 10/2003 | Auerbach et al. | |
| 6,713,813 B2 * | 3/2004 | Marchant | 257/330 |
| 6,768,171 B2 * | 7/2004 | Disney | 257/342 |
| 6,812,524 B2 | 11/2004 | Ahlers et al. | |
| 2003/0155610 A1 | 8/2003 | Schlogl et al. | |
| 2003/0201483 A1 * | 10/2003 | Sumida | 257/302 |
| 2003/0213993 A1 * | 11/2003 | Spring et al. | 257/330 |

FOREIGN PATENT DOCUMENTS

| EP | 1 359 624 | 11/2003 |
|---|---|---|
| JP | 2001-298189 | 10/2001 |

* cited by examiner

*Primary Examiner*—Evan Pert
*Assistant Examiner*—Tan Tran
(74) *Attorney, Agent, or Firm*—Young & Thompson

(57) ABSTRACT

A semiconductor apparatus comprises a gate electrode, a gate insulating layer, a drift region of a first conductivity type formed over a semiconductor substrate of the first conductivity type, a base region of a second conductivity type formed over the drift region, a source region of the first conductivity type formed on the base region and a column region formed in the drift region under the base region, the column region being divided into a plurality of divided portions in depth direction.

11 Claims, 16 Drawing Sheets

| | DOSE AMOUNT OF BORON (atoms/cm²) | | | | WITHSTAND VOLTAGE (V) | WITHSTAND VOLTAGE DEFINITION POINT |
|---|---|---|---|---|---|---|
| | 1500keV | 1000keV | 500keV | 200keV | | |
| A | 4.0E+12 | – | 4.0E+12 | 4.0E+12 | 73V | COLUMN REGION |
| B | 6.0E+12 | – | 6.0E+12 | – | 78V | COLUMN REGION |
| C | 3.0E+12 | 3.0E+12 | 3.0E+12 | 3.0E+12 | 78V | BOTTOM OF THE TRENCH |

| DOSE AMOUNT OF BORON (atoms/cm²) | | | | | WITHSTAND VOLTAGE (V) | WITHSTAND VOLTAGE DEFINITION POINT |
|---|---|---|---|---|---|---|
| | 1500keV | 1000keV | 500keV | 200keV | | |
| A | 2.0E+12 | 4.0E+12 | 2.0E+12 | 2.0E+12 | 69V | COLUMN REGION |
| B | 2.0E+12 | 2.0E+12 | 4.0+E12 | 2.0E+12 | 73V | COLUMN REGION |
| C | 4.0E+12 | 2.0E+12 | 2.0E+12 | 2.0E+12 | 76V | COLUMN REGION |
| D | 2.0E+12 | 2.0E+12 | 2.0E+12 | 2.0E+12 | 76V | BOTTOM OF THE TRENCH |

SEMICONDUCTOR APPARATUS HAVING A DIVIDED COLUMN REGION

BACKGROUND OF THE INVENTION

1. Field of the Invention

This invention relates to a semiconductor apparatus and a method for manufacturing the same.

2. Description of the Related Art

A vertical power MOSFET (Field Effect Transistor) is known as a MOSFET for high voltage operation. The power MOSFET has two important characteristics. One is an on-resistance, and the other is a break down voltage (withstand voltage). There is a trade-off between the on-resistance and the break down voltage. It is difficult for the power MOSFET to have a high break down voltage and a reduced on-resistance.

Super-junction devices are proposed to achieve the power MOSFET having a high break down voltage and a reduced on-resistance.

FIG. 17 is a cross sectional view of the semiconductor apparatus 100 having a super-junction structure (SJ structure) As shown in FIG. 17, the semiconductor apparatus 100 comprises a semiconductor substrate 101, a drift region 102, a base region 108, a source region 109, a gate oxide layer 106A, a gate electrode 107A, an intermediate insulating layer 110, a contact hole 110a, a source electrode 111, a column region 204 and a drain electrode 112.

The drift region 102 is formed on the semiconductor substrate 101, and operates as an electric field relaxation layer. The base region 108 is formed on the drift region 102. The source region 109 is selectively formed in the surface portion of the base region 108. The gate oxide layer 106A is formed on a surface of a trench formed in the base region 108. The gate electrode 107A is formed on the gate oxide layer 106A. The intermediate insulating layer 110 is formed over the gate electrode 107A and the source region 109. The contact hole 110a is formed in the intermediate insulating layer 110. The source electrode 111 is formed over the intermediate insulating layer 110, and the source electrode 111 is electrically connected to the source region 109 via the contact hole 110a. The column region 204 is formed in the drift region 102 under the base region 108. The drain electrode 112 is formed on the bottom surface of the semiconductor substrate 101.

The drift region 102 and the source region 109 have the same conductivity type as the semiconductor substrate 101 (for example, N or N+ type). The base region 108 and the column region 204 have an opposite conductivity type to the semiconductor substrate 101 (for example, P-type). The impurity concentration of the column region 204 is approximately the same as the impurity concentration of the drift region 102. The impurity concentration of the entire column region 204 is uniformed.

As shown in FIG. 17, the semiconductor apparatus 100 having the SJ structure is basically the same as a conventional vertical power MOSFET. The difference between the conventional power MOSFET and the semiconductor apparatus 100 is that the semiconductor apparatus 100 has the column region 204.

When a bias voltage is not applied between the gate electrode and the source electrode and a reverse bias voltage is applied between the drain electrode and the source electrode, depletion regions are extended from two junctions. One junction is a boundary between the drift region 102 and the base region 108, and the other junction is a boundary between the drift region 102 and the column region 204. The semiconductor device 100 becomes off state because the depletion regions are extended.

That is, the boundary between the drift region 102 and the column region 204 extends in depth direction. The depletion region between the drift region 102 and the column region 204 is extended in width direction, and the whole column region 204 and the drift region 102 are depleted when the width of the depletion region becomes wider than distance d shown in FIG. 17.

In case that the semiconductor apparatus 100 has the SJ structure and the distance d is sufficiently short, the break down voltage (withstand voltage) does not depend on an impurity concentration of the electric field relaxation layer. Therefore, the reduced on-resistance and the high break down voltage are achieved by the semiconductor apparatus 100 which has the SJ structure. Japanese unexamined patent publication No. 2001-298189 discloses the semiconductor apparatus having the SJ structure.

In the semiconductor apparatus having the SJ structure, the electric field concentrates at the PN junction under the base region 108 or the region under the gate oxide layer 106A when the reverse bias voltage is applied. Therefore, the characteristic of the gate oxide layer 106A is degraded because an avalanche current flows at above described regions. In case that the gate electrode 107A is formed in a trench as shown in FIG. 17, this problem often occurs.

SUMMARY OF THE INVENTION

According to the aspect of the invention, a semiconductor apparatus comprises a gate electrode, a gate insulating layer, a drift region of a first conductivity type formed over a semiconductor substrate of the first conductivity type, a base region of a second conductivity type formed over the drift region, a source region of the first conductivity type formed on the base region and a column region formed in the drift region under the base region, the column region being divided into a plurality of divided portions in depth direction.

According to another aspect of the invention, a semiconductor apparatus comprises a gate electrode, a gate insulating layer, a drift region of the first conductivity type formed over a semiconductor substrate of the first conductivity type, a base region of a second conductivity type formed over the drift region, a source region of the first conductivity type formed on the base region and a column region formed in the drift region under the base region, the column region having at least one portion having a higher impurity concentration than an average impurity concentration of the column region.

According to another aspect of the invention, a method for manufacturing a semiconductor apparatus comprises forming a drift region of a first conductivity type over a semiconductor substrate of the first conductivity type, forming a base region of a second conductivity type over the drift region, forming a gate insulating layer, forming a gate electrode on the gate insulating layer, forming a source region of the first conductivity type on the base region, forming a first divided portion of a column region in the drift region under the base region and forming a second divided portion of the column region in the drift region under the base region.

According to another aspect of the invention, a method for manufacturing a semiconductor apparatus comprising, forming a drift region of a first conductivity type over a semiconductor substrate of the first conductivity type, form- ing a base region of a second conductivity type over the drift region, forming a gate insulating layer, forming a gate electrode on the gate insulating layer, forming a source region of the first conductivity type on the base region, forming a column region in the drift region under the base region and forming a high impurity concentration portion in the column region, the high impurity concentration portion having a higher impurity concentration than an average impurity concentration of the column region.

According to the present invention, when the reverse bias voltage is applied to the semiconductor apparatus, the avalanche current which flows in the column region does not flow to near the gate electrode.

BRIEF DESCRIPTION OF THE DRAWINGS

The above and other objects, advantages and features of the present invention will be more apparent from the following description taken in conjunction with the accompanying drawings, in which:

FIG. 10 is a table showing a condition for manufacturing the semiconductor apparatus.

FIG. 16 is a table showing a condition for manufacturing the semiconductor apparatus.

PREFERRED EMBODIMENT OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
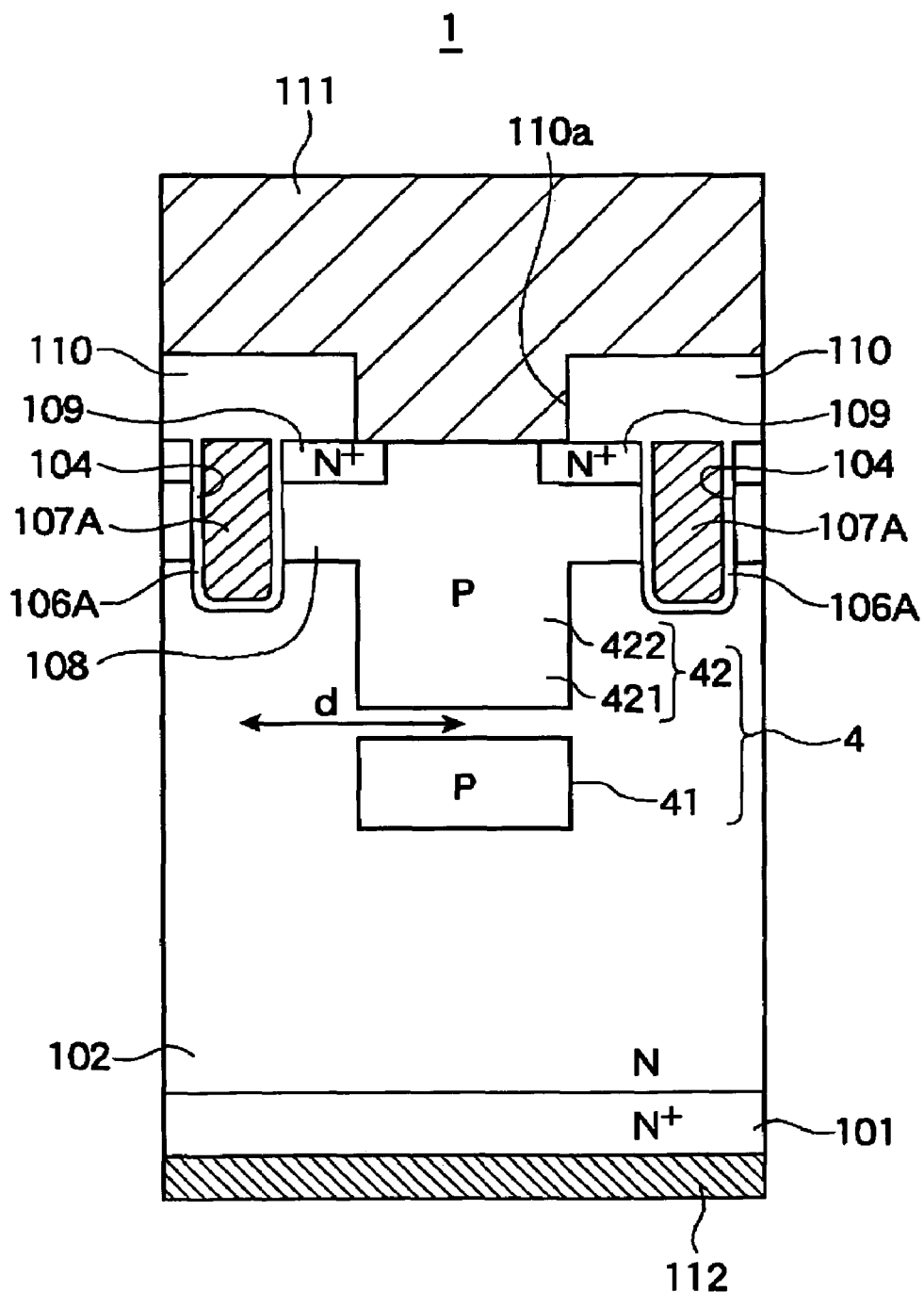
FIG. 1 is a cross sectional view showing the semiconductor apparatus of the first embodiment.

FIG. 1 shows a cross sectional view of a semiconductor apparatus 1 of the first embodiment. As shown in FIG. 1, the semiconductor apparatus 1 is a power MOSFET having a SJ structure and a trench gate. The semiconductor apparatus 1 comprises a semiconductor substrate 101, a drift region 102, a base region 108, a source region 109, a gate oxide layer 106A, a gate electrode 107A, an intermediate insulating layer 110, a contact hole 110a, a source electrode 111, a column region 4 and a drain electrode 112.

The drift region 102 is formed on the semiconductor substrate 101. The base region 108 is formed on the drift region 102. The source region 109 is selectively formed in the surface portion of the base region 108. The gate oxide layer 106A is formed on a surface of a trench formed in the base region 108. The gate electrode 107A is formed on the gate oxide layer 106A. The intermediate insulating layer 110 is formed over the gate electrode 107A and the source region 109. The contact hole 110a is formed in the intermediate insulating layer 110. The source electrode 111 is formed over the intermediate insulating layer 110, and the source electrode 111 is electrically connected to the source region 109 via the contact hole 110a. The column region 4 is formed in the drift region 102 under the base region 108. The drain electrode 112 is formed on the bottom surface of the semiconductor substrate 101.

The semiconductor substrate 101, the drift region 102 and the source region 109 have a first conductivity type. The base region 108 and the column region 4 have a second conductivity type. For example, the semiconductor substrate 101 and the source region 109 are N+ type and the drift region is N type. The base region and the column region are P type, in this embodiment.

In the semiconductor apparatus 1 of this embodiment, the column region 4 is divided into a plurality of divided portions. A first divided portion 41 and a second divided portion 42 are shown in FIG. 1. As shown in FIG. 1, the first divided portion 41 is formed in the drift region 102 apart from the second divided portion 42 in a depth direction.

As described above, the semiconductor apparatus 1 has a trench gate structure. The gate electrode 107A is formed to extend from the base region 108 to the drift region 102.

In this embodiment, there are two divided portions. The divided portion which is formed at the shallowest portion is the second divided portion 42. The bottom of the second divided portion 42 is deeper than the bottom of the gate electrode 107A. If there are divided portions more than two, the bottom of the divided portion which is formed at the shallowest portion is deeper than the bottom of the gate electrode 107A.

Each of the dose amount of the drift region 102 and the column region 4 is adjusted so that the depletion layer between them has a width d when the reverse bias voltage is applied.

A method for manufacturing the semiconductor apparatus 1 is described with reference to FIG. 2 to FIG. 7.

Figure 2:
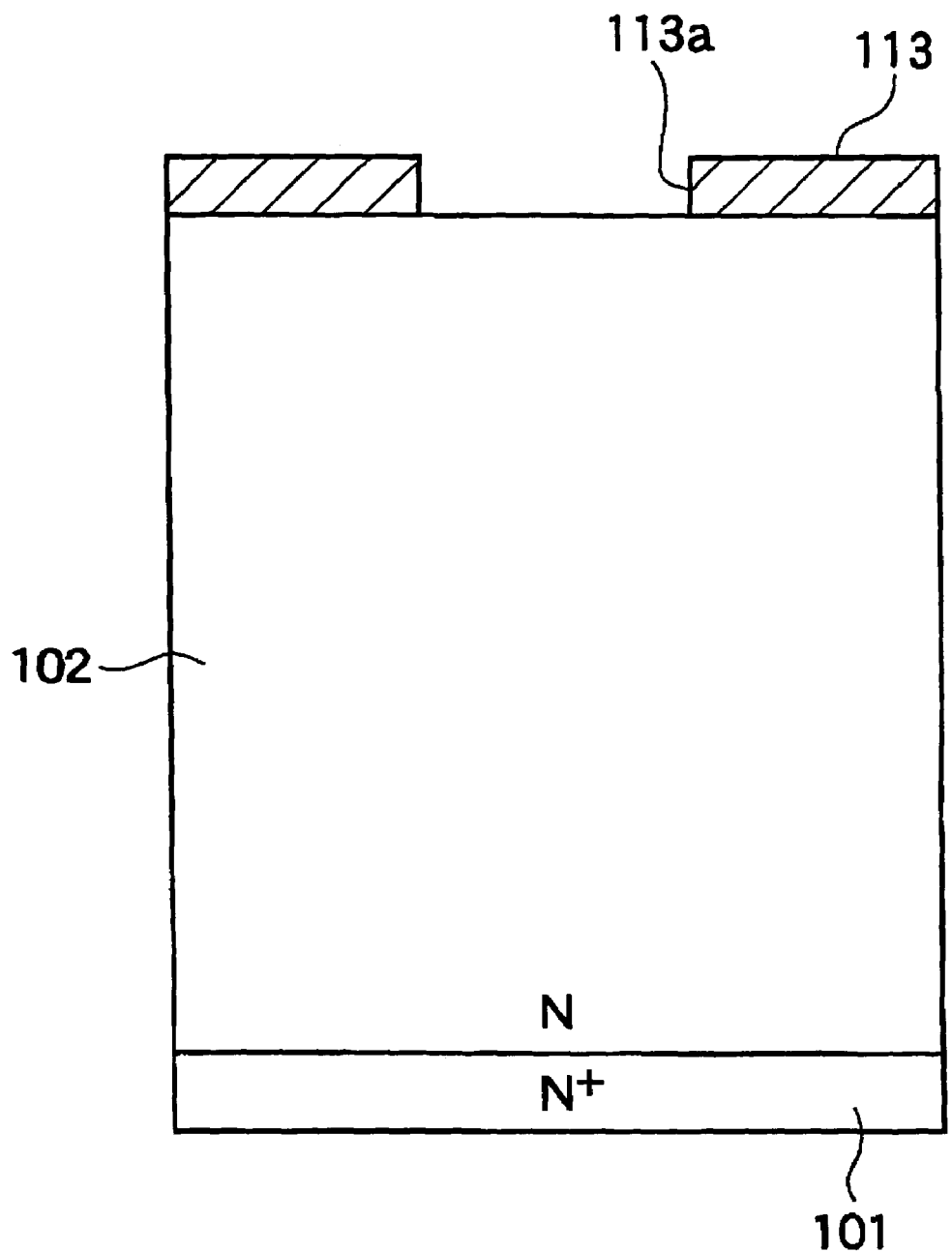
FIG. 2 is a cross sectional view showing a method for manufacturing the semiconductor apparatus of the first embodiment.

As shown in FIG. 2, an N type drift region (phosphorous doped region) 102 is formed on the heavily doped N type semiconductor substrate 101 using an epitaxial growth. The drift region 102 operates as an electric field relaxation layer.

An oxide layer 113 is formed on the drift region 102 using a CVD method. An opening portion 113a is formed by selectively etching the oxide layer 113 using a photolithographic method. The oxide layer 113 with the opening portion 113a is used as a mask in forming the column region 4.

Then, boron is introduced into the drift region 102 using the oxide layer 113 as a mask. Plurality times of ion implantation, for example, three times of ion implantation are carried out to form the column region 4. The energy of each ion implantation is varied.

Figure 3:
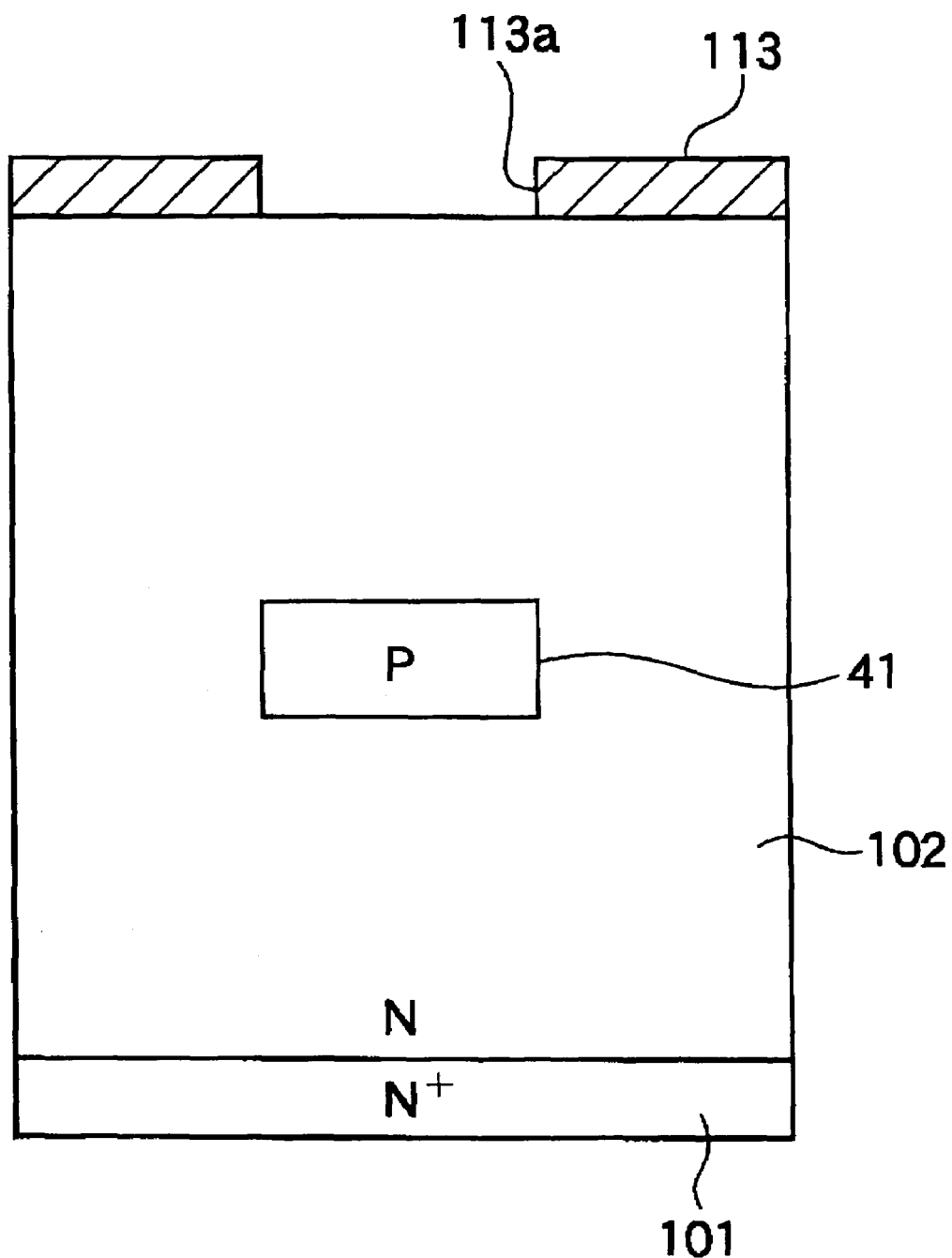
FIG. 3 is a cross sectional view showing a method for manufacturing the semiconductor apparatus of the first embodiment.
Figure 4:
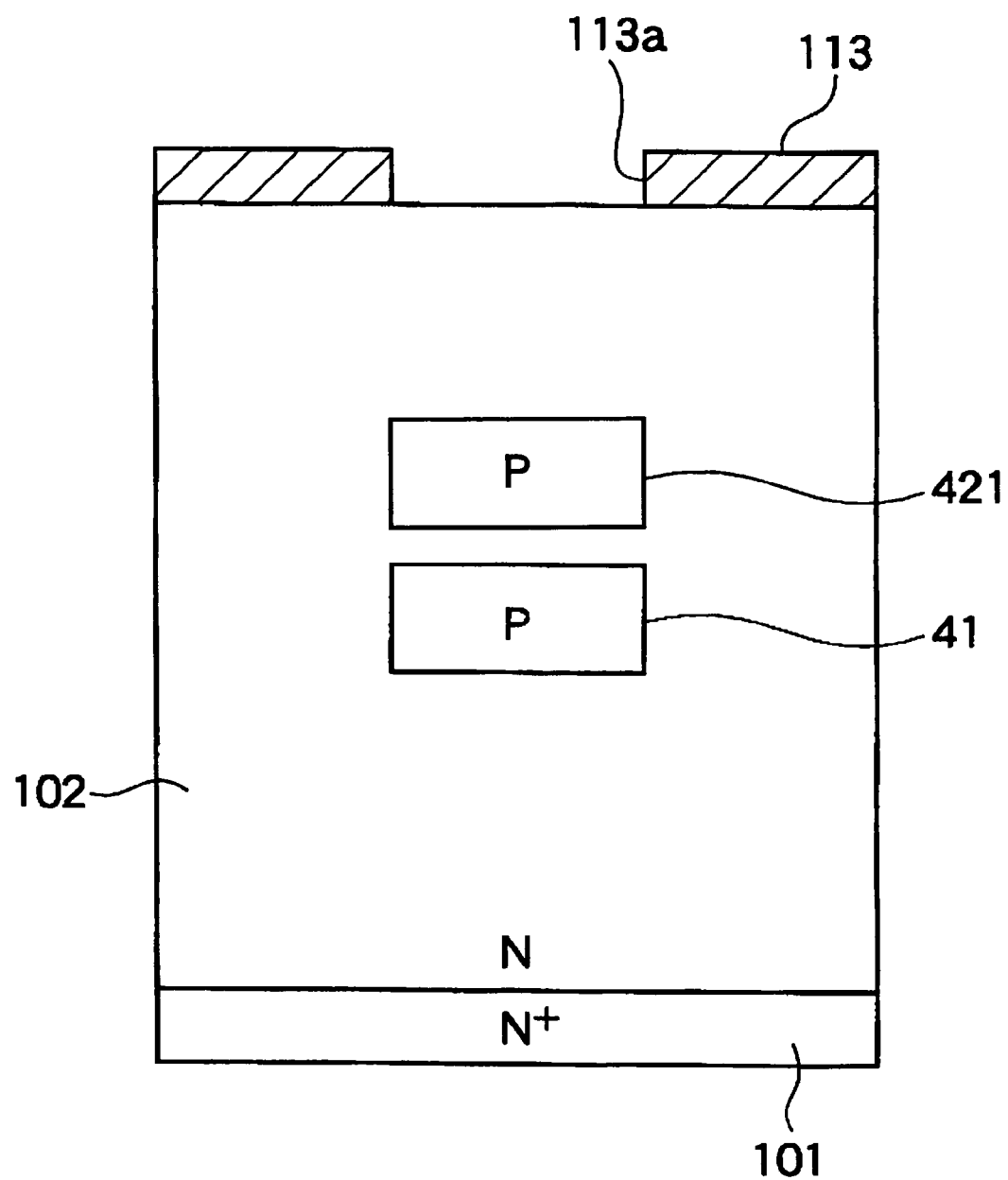
FIG. 4 is a cross sectional view showing a method for manufacturing the semiconductor apparatus of the first embodiment.

For example, the first divided portion (deeper divided portion) 41 is formed by carrying out the first ion implantation with relatively high energy (please refer to FIG. 3). The lower part 421 of the second divided portion 42 is formed by carrying out the second ion implantation of relatively low energy (please refer to FIG. 4).

Figure 5:
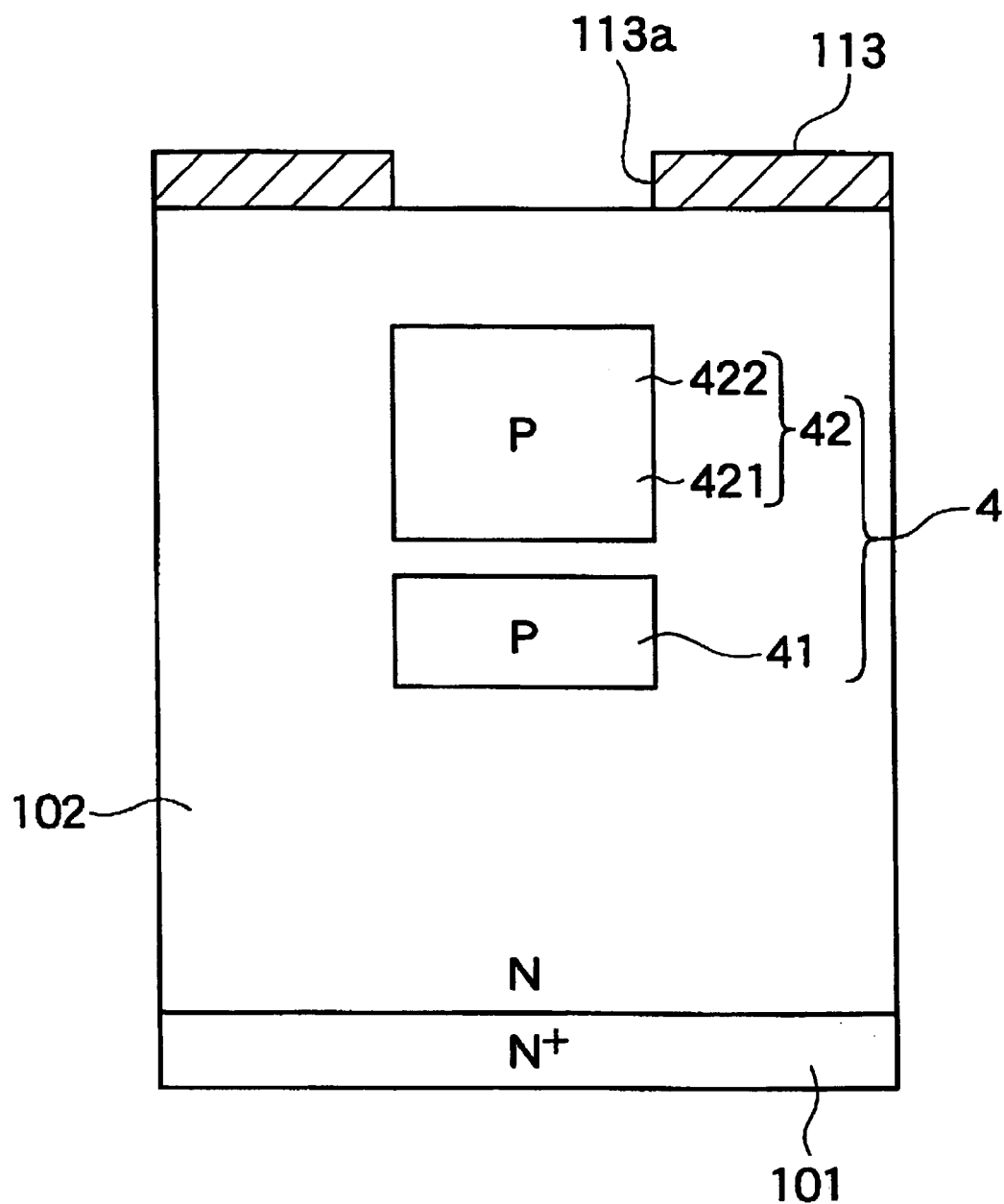
FIG. 5 is a cross sectional view showing a method for manufacturing the semiconductor apparatus of the first embodiment.
Figure 6:
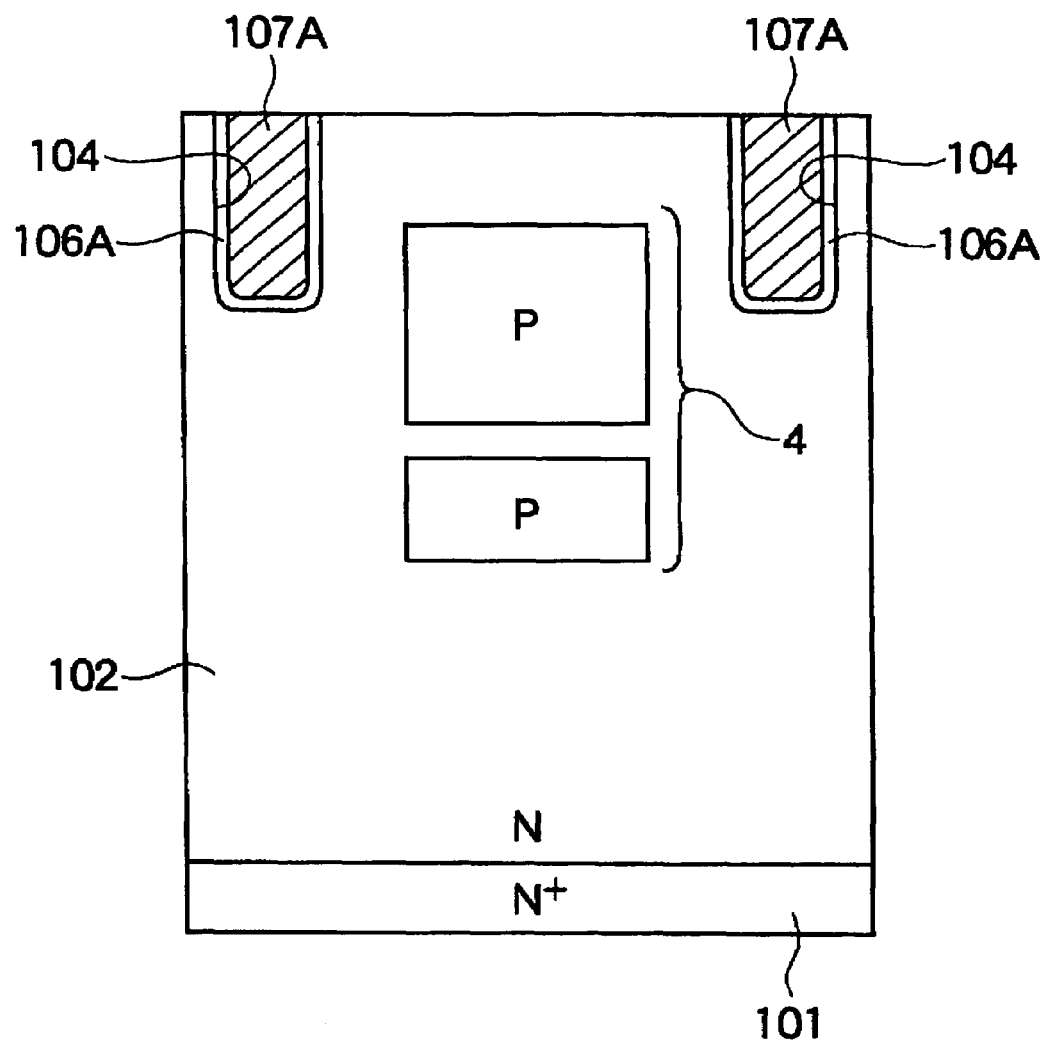
FIG. 6 is a cross sectional view showing a method for manufacturing the semiconductor apparatus of the first embodiment.
Figure 7:
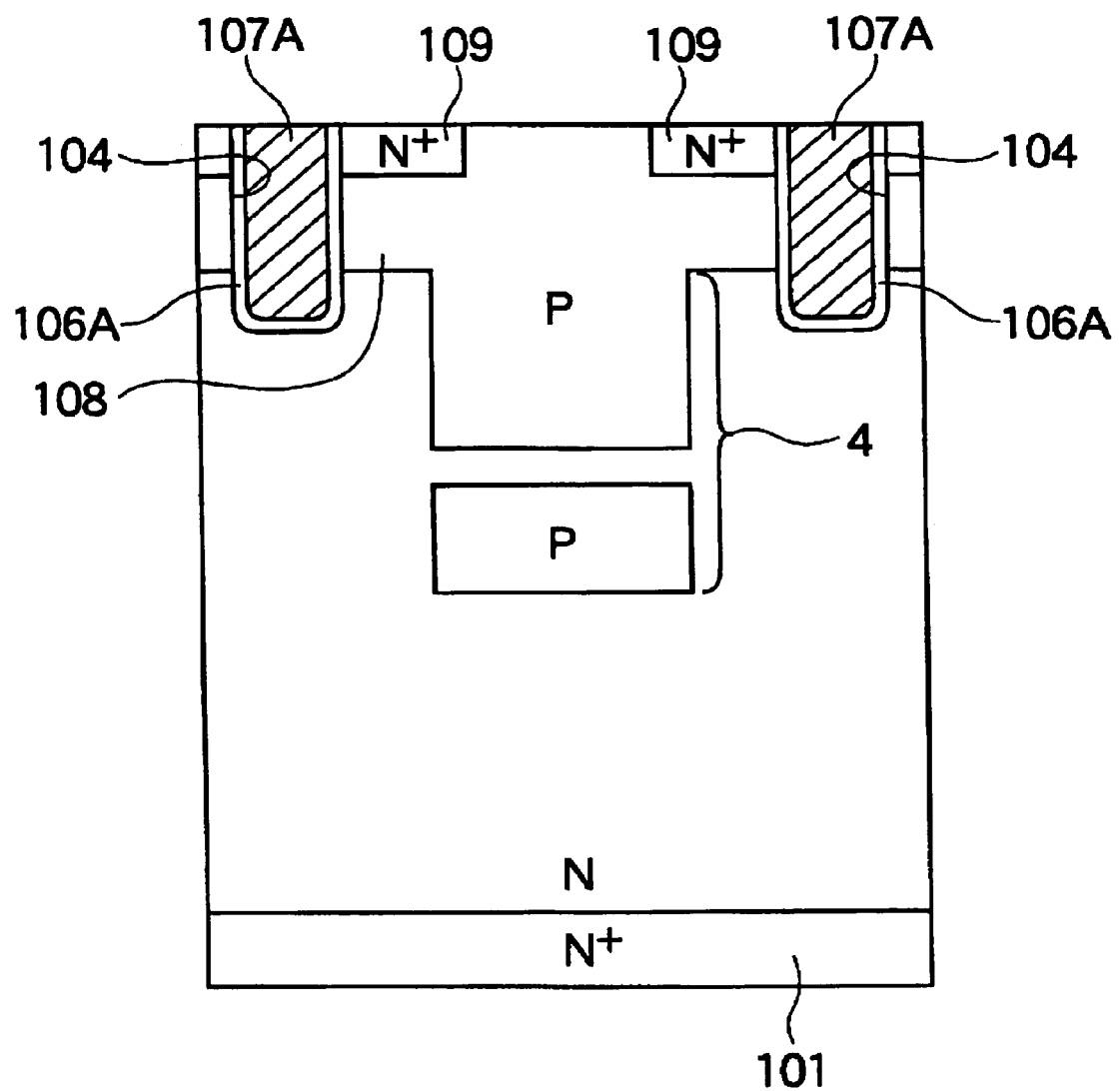
FIG. 7 is a cross sectional view showing a method for manufacturing the semiconductor apparatus of the first embodiment.

The, the third ion implantation of low energy is performed to form the upper part 422 of the second divided portion 42. The energy of the third ion implantation is lower than that of the second ion implantation. The lower part 421 and the upper part 422 are connected with each other as shown in FIG. 5.

As described above, the column region 4 having a plurality of divided portions is formed. Two divided portions 41 and 42 are formed in the embodiment; however, it is possible to form more than two divided portions. The order of the first, second and third ion implantation is not limited as described above. For example, the low energy ion implantation may be performed before the high energy ion implantation.

In performing the ion implantation, an ion scattering occurs near the inside surface of the opening portion 113a. The ion scattering prevents the first divided portion 41 and the second divided portion 42 (including the lower part 421 and the upper part 422) from diffusing to form a spherical shape. The first divided portion 41 and the second divided portion 42 diffuse to form a substantial column respectively.

Then, the oxide layer 113 is removed, and the trench 104 is selectively formed using a photo lithographic method. The gate oxide layer 106a is formed on the inner surface of the trench 104 using a thermal oxidation.

A polysilicon is formed over the whole surface of the semiconductor substrate 101, and the trench 104 is filled with the polysilicon. Then, an etching is performed to remove the polysilicon except for the buried polysilicon in the trench 104. The buried polysilicon in the trench 104 forms the gate electrode 107A.

Boron is introduced into the drift region 102 by an ion implantation using the gate electrode 107a as a mask. The gate electrode 107 works as a mask of a self-alignment process. The ion implantation makes the upper portion of the drift region 102 the base region 108 of P type. That is, the base region 108 of P type is formed on the drift region 102.

Arsenic is selectively introduced into the base region 108 by an ion implantation using a photolithographic process, and a thermal treatment is performed. The ion implantation and thermal treatment make the upper peripheral portion of the base region 108 the source region 109 of N type. That is, the source region 109 of N type is formed on the base region 108. The source region 109 is formed in the upper peripheral portion of the base region 108.

A BPSG (Boro-Phospho-Silicate Glass) layer is formed as an intermediate insulating layer 110 over the semiconductor substrate 101 using a CVD method. The intermediate insulating layer 110 is selectively etched using a photolithographic process. The contact hole 110a is formed over the base region 108 and the source region 109 as shown in FIG. 1.

An Aluminum layer is formed over the top surface of the semiconductor substrate 101 using a sputtering. The contact hole 110a is filled with the aluminum and the source electrode 111 is formed on the base region 108 and the source region 109. The drain electrode 112 is formed on the bottom surface of the semiconductor substrate 101.

The semiconductor apparatus 1 of this embodiment is fabricated as above described. The operation of the semiconductor apparatus 1 of the embodiment is described below.

When a bias voltage is not applied between the gate electrode and the source electrode and a reverse bias voltage is applied between the drain electrode and the source electrode, depletion regions are extended from two junctions. One junction is a boundary between the drift region 102 and the base region 108, and the other junction is a boundary between the drift region 102 and the column region 4. A current does not flow between the source and the drain. The semiconductor device 1 becomes off state because the depletion regions are extended.

That is, a boundary between the drift region 102 and the column region 4 extends in-depth direction. The depletion region between the drift region 102 and the column region 4 is extended in width direction, and the whole column region 4 and drift region 102 are depleted when the width of the depletion region becomes wider than distance d shown in FIG. 1.

On the other hand, when a bias voltage is applied between the gate electrode and the source electrode, a surface of the base region 108 becomes an inverted state. A current flows between the drain electrode and the source electrode based on a voltage between the drain electrode and the source electrode. The semiconductor device 1 becomes on state. Ron (on-resistance) depends on resistivity of the drift region 102. Even if the impurity concentration of the drift region 102 is increased in order to achieve a reduced on-resistance, when the distance d is sufficiently narrow, the drift region 102 and the whole column region 4 is depleted. Therefore, degradation of the break down voltage (withstand voltage) is prevented.

Figure 8:
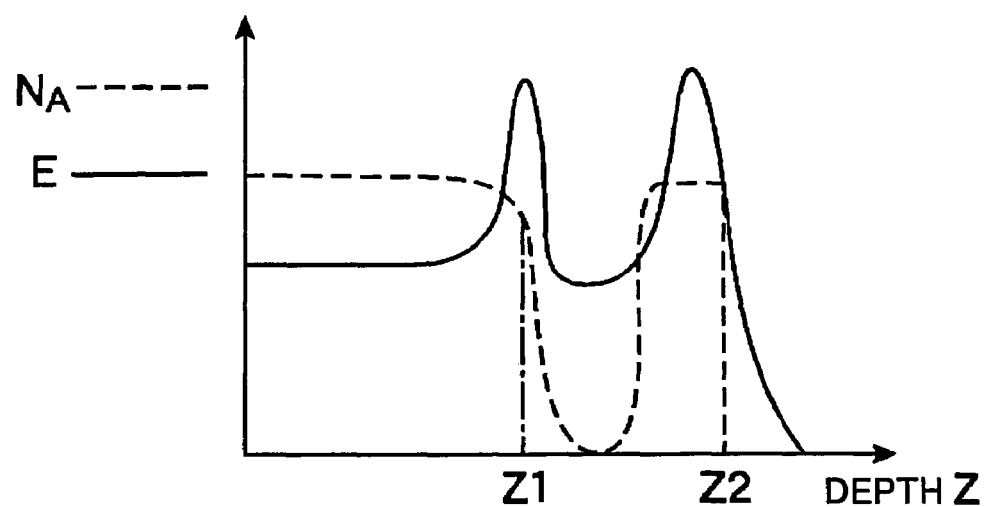
FIG. 8 shows a relationship between depth and electric field intensity, and between depth and acceptor concentration.

A solid line of FIG. 8 shows a relationship between an electric field intensity E and the depth Z. A dashed line of FIG. 8 shows a relationship between an accepter concentration NA and the depth Z.

In FIG. 8, Z1 corresponds to the bottom of the second divided portion 42, and Z2 corresponds to the bottom of the first divided portion 41. As shown in FIG. 8, the electric field intensity E has two peaks at Z1 and Z2.

A PN junction is formed at the bottom of the second divided portion 42. That is, the PN junction is formed at the boundary between the drift region 102 and the second divided portion 42. As shown in FIG. 8, a concentration gradient of the acceptor concentration NA is increased at Z1. The electric field intensity E is also increased at Z1 partly.

That is, as the column region 4 is divided into two regions, the semiconductor apparatus 1 has a portion where the electric field intensity is partly increased when the reverse bias voltage is applied.

Thereby, an avalanche breakdown occurs preferentially in the column region 4. An avalanche current produced in the column region 4 directly flows to the source contact via the base region 108.

Figure 9:
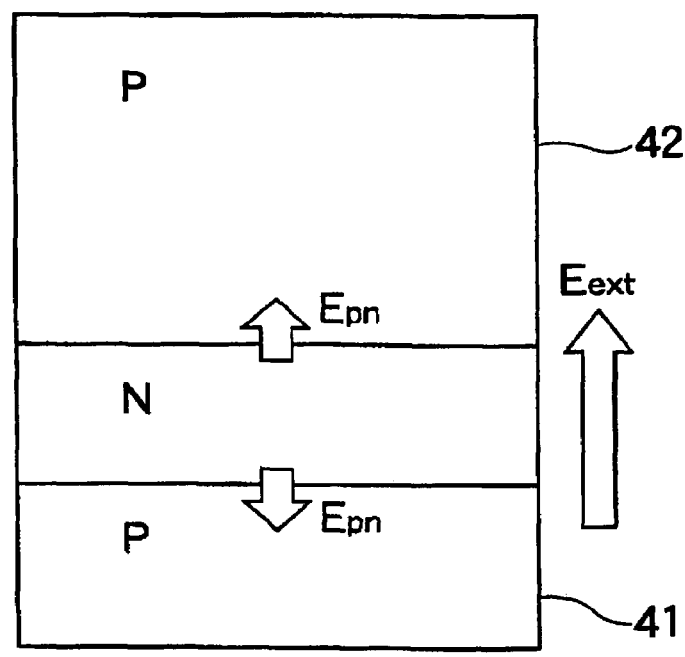
FIG. 9 is a cross sectional view showing the electric field.

The relationship between the concentration gradient and the electric field is now described. The depleted P type region has a negative charge, and the depleted N type region has a positive charge. As shown in FIG. 9, the electric field Epn is formed from the n type region to p type region at the PN junction.

A voltage difference Vbi, which corresponds to a built-in potential, exists at the PN junctions. For example, the voltage difference Vbi is 0.7-0.8v. The electric field around the PN junction can be found by solving the Poisson's equation under the condition described above.

Assuming that the impurity concentration (acceptor concentration: NA, donor concentration: ND) is NA=ND=$2*10^{16}$ cm$^{-3}$, the maximum electric field intensity Epn becomes equal to or less than $5*10^4$V/cm. The above described impurity concentration is an example of the typical impurity concentration of the semiconductor apparatus having the SJ structure.

That is, if the PN junction is formed as a result of the divided column region, the electric field Epn is added to the voltage Eext which is applied to the semiconductor apparatus in depth direction.

A critical voltage of the semiconductor apparatus which has the impurity concentration of NA=ND=$2*10^{16}$ cm$^{-3}$ is approximately $3*10^5$ V/cm. Therefore, the influence of the Epn to the whole electric field is significant.

Example of Condition to Form the Column region 4

A condition to form the column region is described below as an example. FIG. 10 shows a table of dose amount of the column region, withstand voltage characteristics and a withstand voltage definition point. Row A and B of the table shown in FIG. 10 correspond to the first embodiment, and row C corresponds to a comparative example.

In evaluating the conditions shown in the table of FIG. 10, the semiconductor apparatus is assumed as follows. The size of the cell is 4 um, and the width of the opening portion 113a is 1 um. The opening portion 113a is formed in the oxide layer 113 to form the column region 4 (please refer to FIG. 2 to FIG. 4). The whole dose amount of the column region is $1.2*10^{13}$ cm$^{-2}$.

In the table shown in FIG. 10, row A represents a condition to form the column region 4 shown in FIG. 1. Three times of ion implantation is carried out. The dose amount of boron is $4*10^{12}$ atoms/cm$^2$ in each ion implantation. The energy of the first ion implantation is 1500 KeV. The first ion implantation forms the first divided portion 41. The energy of the second ion implantation is 500 KeV. The second ion implantation forms the lower part 421 of the second divided portion 42. The energy of the third ion implantation is 200 KeV. The third ion implantation forms the upper part 422 of the second divided portion 42. The impurity concentration of the column region 4(41, 421, 422) becomes $8*10^{16}$ cm$^{-3}$ according to the ion implantations. The depth of the bottom of the first divided portion 41, that is, the depth of the column region 4, is approximately 3 um in this example.

In the table shown in FIG. 10, row B represents a condition to form the column region 4 that does not have the upper part 422 of the second divided portion 42. That is, the first divided portion 41 and the lower part 421 of the second divided portion 42 are formed; however, the upper part 422 of the second divided portion 42 is not formed. Therefore, two times of ion implantation is carried out. The dose amount of boron is $6*10^{12}$ atoms/cm$^2$ in each ion implantation. The energy of the first ion implantation is 1500 KeV. The first ion implantation forms the first divided portion 41. The energy of the second ion implantation is 500 KeV. The second ion implantation forms second divided portion 42. The impurity concentration of the column region 4(41, 421) becomes $1.2*10^{17}$ cm$^{-3}$ according to the ion implantations.

In the table shown in FIG. 10, row C represents a condition to form the column region of the comparative example. In the comparative example, the column region is not divided. That is, the first divided portion 41 and the second divided portion 42 are connected. In the comparative example, four times of ion implantation is carried out. The dose amount of boron is $3*10^{12}$ atoms/cm$^2$ in each ion implantation. The energy of the first ion implantation is 1500 KeV. The first ion implantation forms the first divided portion 41. The energy of the second ion implantation is 1000 KeV. The second ion implantation forms a connecting portion which connects the first divided portion 41 and the second divided portion 42. The energy of the third ion implantation is 500 KeV. The third ion implantation forms the lower part 421 of the second divided portion 42. The energy of the fourth ion implantation is 200 KeV. The fourth ion implantation forms the upper part 422 of the second divided portion 42. In the comparative example, the impurity concentration of the entire column region 4 is uniformed. The impurity concentration of the column region 4 of the comparative example is $6*10^{16}$ cm$^{-3}$.

The withstand voltage of the semiconductor device of the first embodiment is 73V or 78V as shown in row A and B of FIG. 10. That is, the withstand voltage is substantially the same as the comparative example, that is shown in row C of FIG. 10.

As shown in row A and B of FIG. 10, the withstand voltage definition point is located in the column region when the column region is divided. More precisely, the withstand voltage definition point is located at the PN junction on the bottom of the second divided portion 42. Therefore, the avalanche current flows in the column region when the column region is divided, and the gate oxide layer 106A is not damaged.

On the other hand, when the column region is not divided as shown in row C of FIG. 10, the withstand voltage definition point is located at the bottom of the trench gate (This location corresponds to the bottom of trench 104 of FIG. 1). Therefore, the avalanche current flows near the gate oxide layer 106A, and the gate oxide layer 106A may be damaged because of the avalanche current.

According to the semiconductor apparatus 1 of the first embodiment, the semiconductor apparatus 1 has a SJ structure which has the column region 4 formed in the drift region 102 under the base region 108. The trade-off between the break down voltage and the on-resistance is improved compared with that of the conventional power MOSFET. That is, the withstand voltage characteristics is not degraded, and the on-resistance can be reduced.

The column region 4 is divided into a plurality of divided portions 41 and 42 in this embodiment. Therefore, the electric field intensity is partly increased when the reverse bias voltage is applied. The avalanche break down occurs preferentially in the column region 4. The avalanche current produced in the column region 4 directly flows to the source contact via the base region 108. The avalanche current is not concentrated near the gate electrode 107A (that is, a portion along the trench 104 of the base region 108). Therefore, an electrical stress to the semiconductor apparatus 1, such as a hole implantation to the gate oxide layer 106A, can be avoided. The damage to the gate oxide layer 106A can be avoided.

The bottom of the divided portion, which is formed in the shallowest portion, is deeper than the bottom of the gate electrode 107A. When the reverse bias voltage is applied to the semiconductor apparatus 1, the portion where the electric field intensity is partly increased is apart form the bottom of the trench 104. The avalanche current which flows in the column region 4 does not flow to near the gate electrode 107A.

Especially, this invention is more effective when the divided portion has higher impurity concentration. In the example shown in row B of FIG. 10, even if a repetitive avalanche switching test of high temperature (150 degree centigrade) is carried out, there is little influence on the gate oxide layer, and the gate oxide capacitance versus voltage characteristics is not shifted.

The ion scattering occurs near the inside surface of the opening portion 113a. The linear boundaries can be formed between the drift region 102 and each of the first divided portion 41 and the second divided portion 42 (including lower part 421 and upper part 422).

In the first embodiment, the column region 4 is divided into two divided portions. The column region 4, however, may be divided into more than two divided portions.

Figure 11:
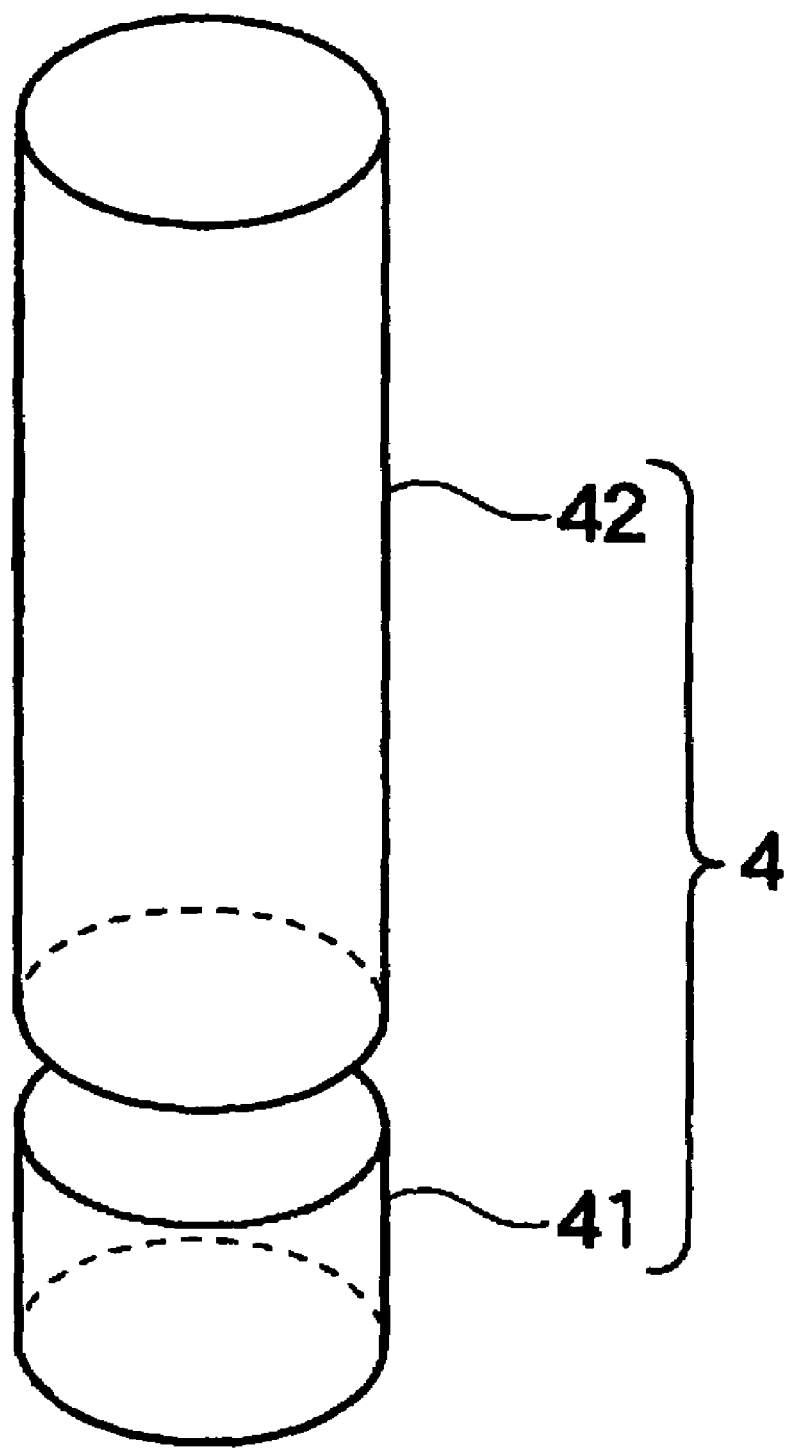
FIG. 11 is a perspective view showing the column region.
Figure 12:
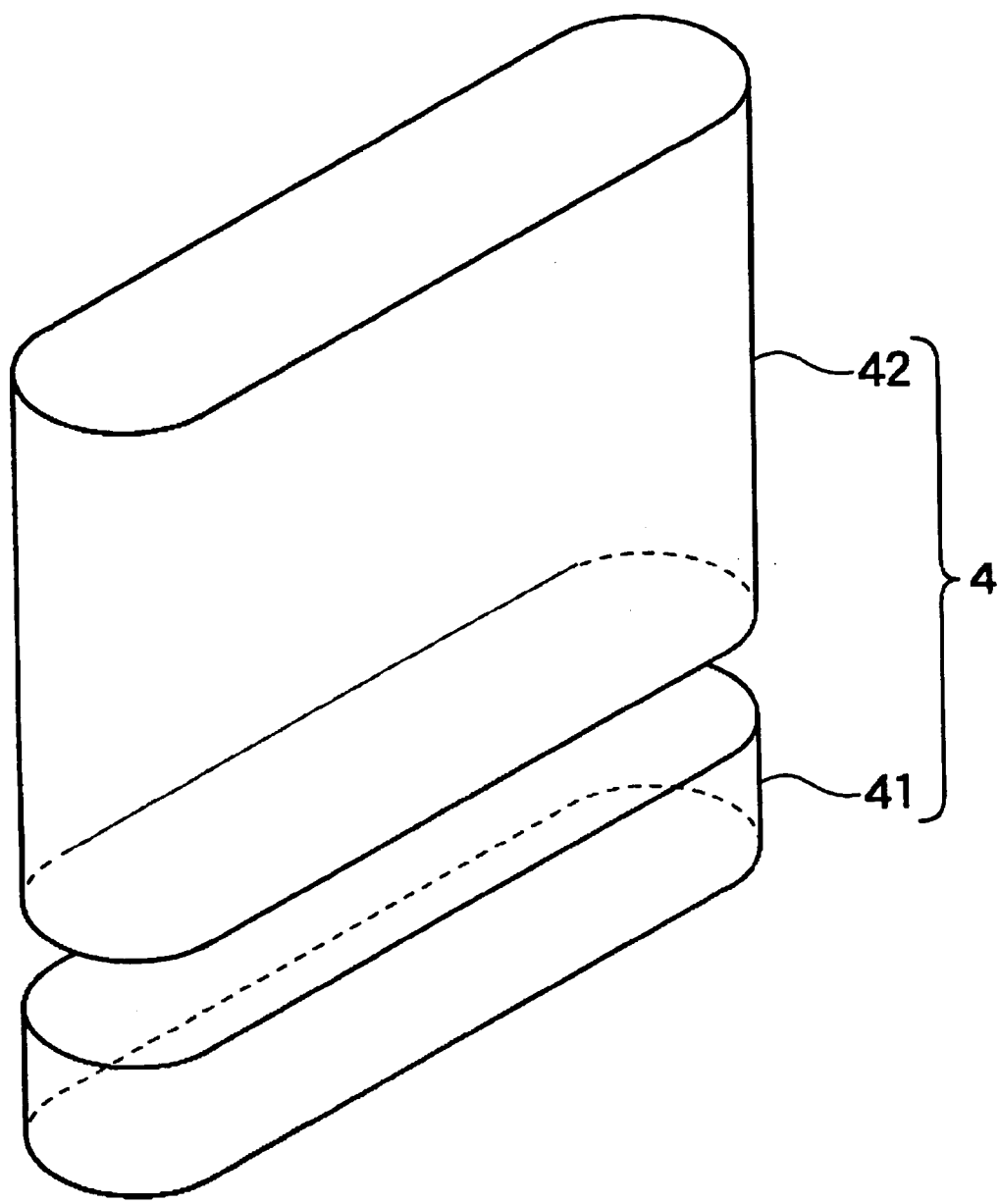
FIG. 12 is a perspective view showing the column region.

The first and second divided portion 41 and 42 may be shaped like a column as shown in FIG. 11, or be shaped like a wall which has an extending portion parallel to the top surface of the semiconductor substrate 101 as shown in FIG. 12.

Other Example of the First Embodiment

Figure 13:
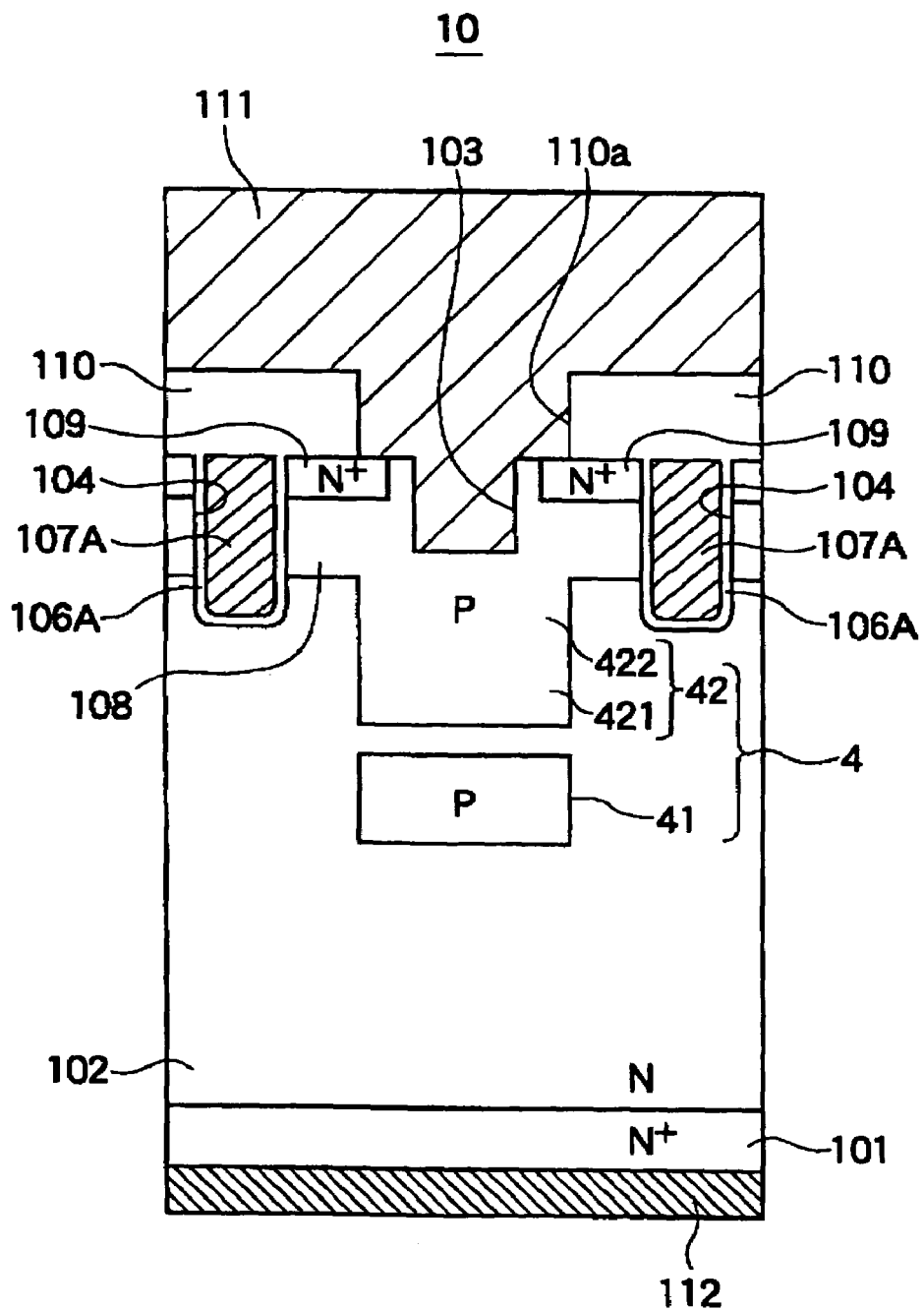
FIG. 13 is a cross sectional view showing the semiconductor apparatus of another example of the first embodiment.

FIG. 13 shows another example of semiconductor apparatus 10 of the first embodiment.

The semiconductor apparatus 10 is different from the semiconductor apparatus 1 in having a trench 103 at the center portion of the base region 108 and the source electrode formed in the trench 103. The other structures are the same as the semiconductor apparatus 1 shown in FIG. 1. Descriptions about the same structures of the semiconductor apparatus 1 are omitted.

The method for manufacturing the semiconductor apparatus 10 is slightly different from the method for manufacturing the semiconductor apparatus 1. The difference is described below.

As shown in FIG. 2, the oxide layer 113 having the opening 113a is formed on the drift region 102. The trench 103 is formed by an etching using the oxide layer 113 as a mask before the formation of the column region 4.

Then, the column region 4 is formed by an ion implantation via trench 103 using the oxide layer 113 as a mask. The source electrode 111 is formed to bury the trench 103.

The same advantages of the first embodiment are achieved in this example. Further, since the trench 103 is formed in the base region 108, the column region 4 can be formed in a deeper portion even if the energy of the ion implantations are the same as the first embodiment.

Second Embodiment

In the first embodiment, the column region is divided into a plurality of divided portions. Thereby, the electric field intensity is partly increased. In the second embodiment, an impurity concentration of the column region is controlled. At least one high impurity concentration portion is formed in column region. The high impurity concentration portion means a portion which has a higher impurity concentration than the average impurity concentration of the column region. In the second embodiment, the electric field intensity is partly increased because of the high impurity concentration portion.

Figure 14:
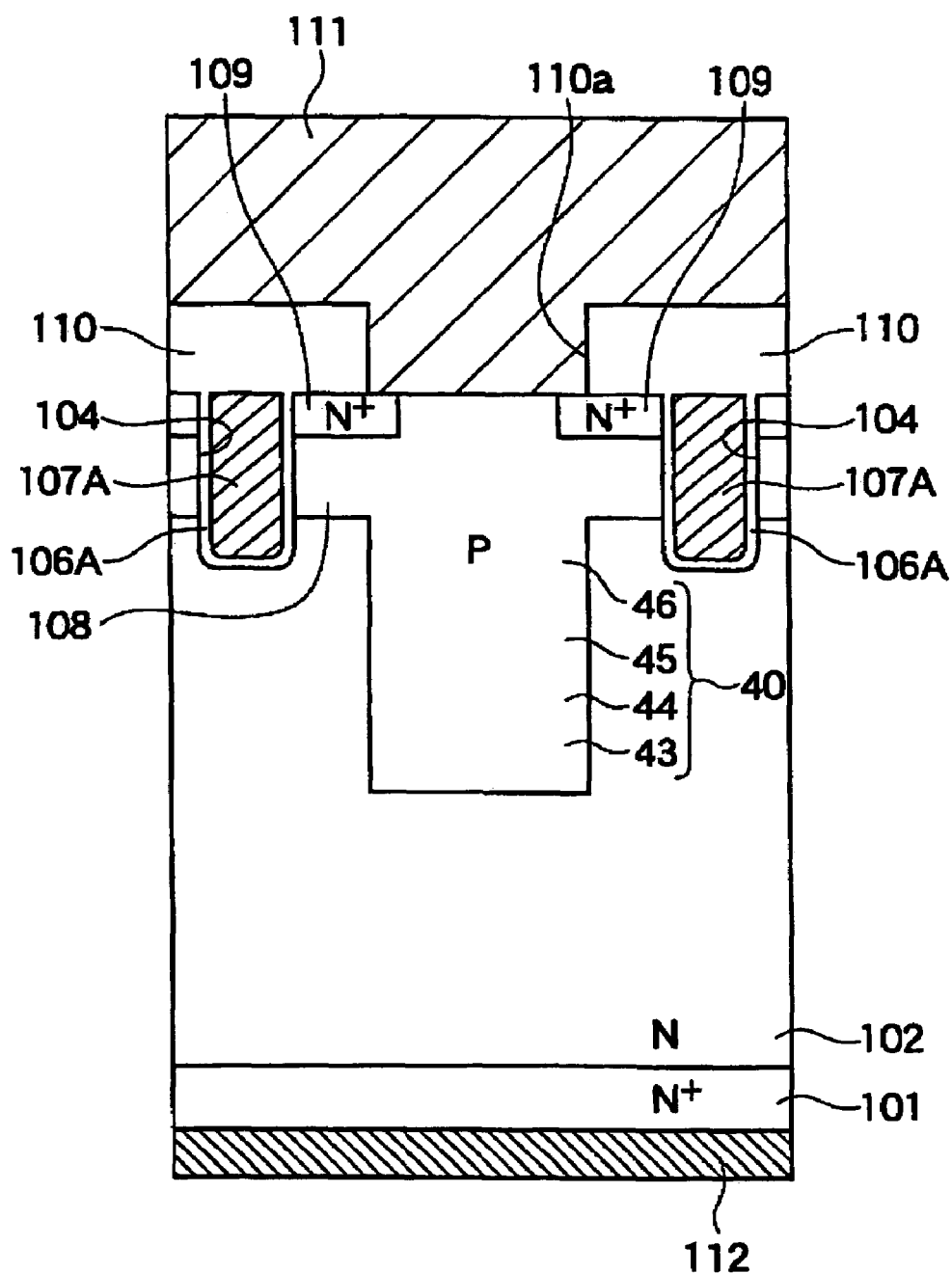
FIG. 14 is a cross sectional view showing the semiconductor apparatus of the second embodiment.

As shown in FIG. 14, a semiconductor apparatus 2 of the second embodiment is different from the semiconductor apparatus 1 in a column region 40. The other structures are the same as the semiconductor apparatus 1. Descriptions about the same structures of the semiconductor apparatus 1 are omitted.

As shown in FIG. 14, the column region 40 of the semiconductor apparatus 2 has a first portion 43, a second portion 44, a third portion 45 and a fourth portion 46. The first portion 43 is the deepest portion, and the fourth portion 46 is the shallowest portion. These portions are formed by carrying out four times of ion implantation.

In the second embodiment, at least one of four portions (a first portion 43, a second portion 44, a third portion 45 and a fourth portion 46) has a higher impurity concentration than that of other portions. Thereby, the column region 40 has the high impurity concentration portion.

The high impurity concentration portion is formed deeper than the bottom of the trench 104. In this embodiment, the second portion 44 has the higher impurity concentration.

Figure 15:
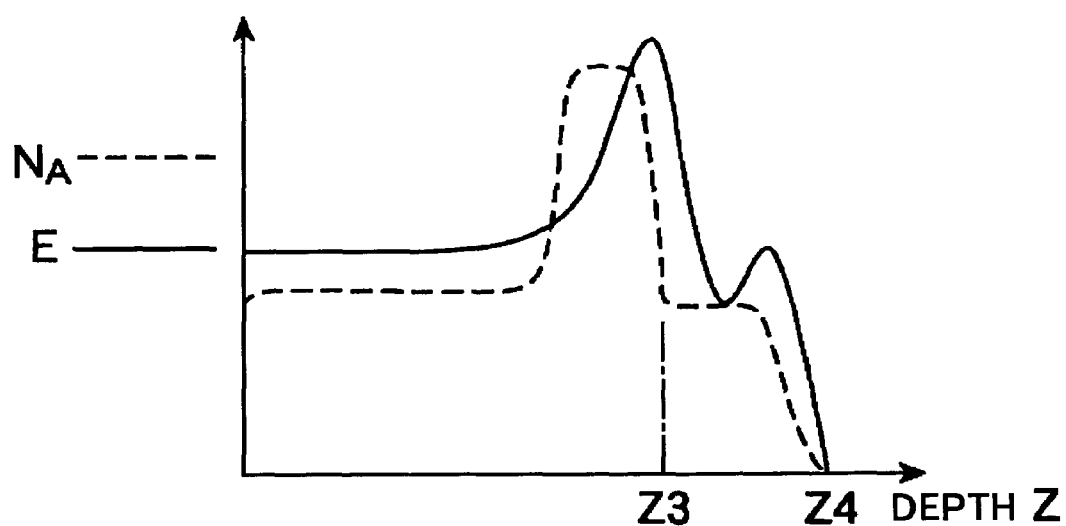
FIG. 15 shows a relationship between depth and electric field intensity, and between depth and acceptor concentration.
Figure 17:
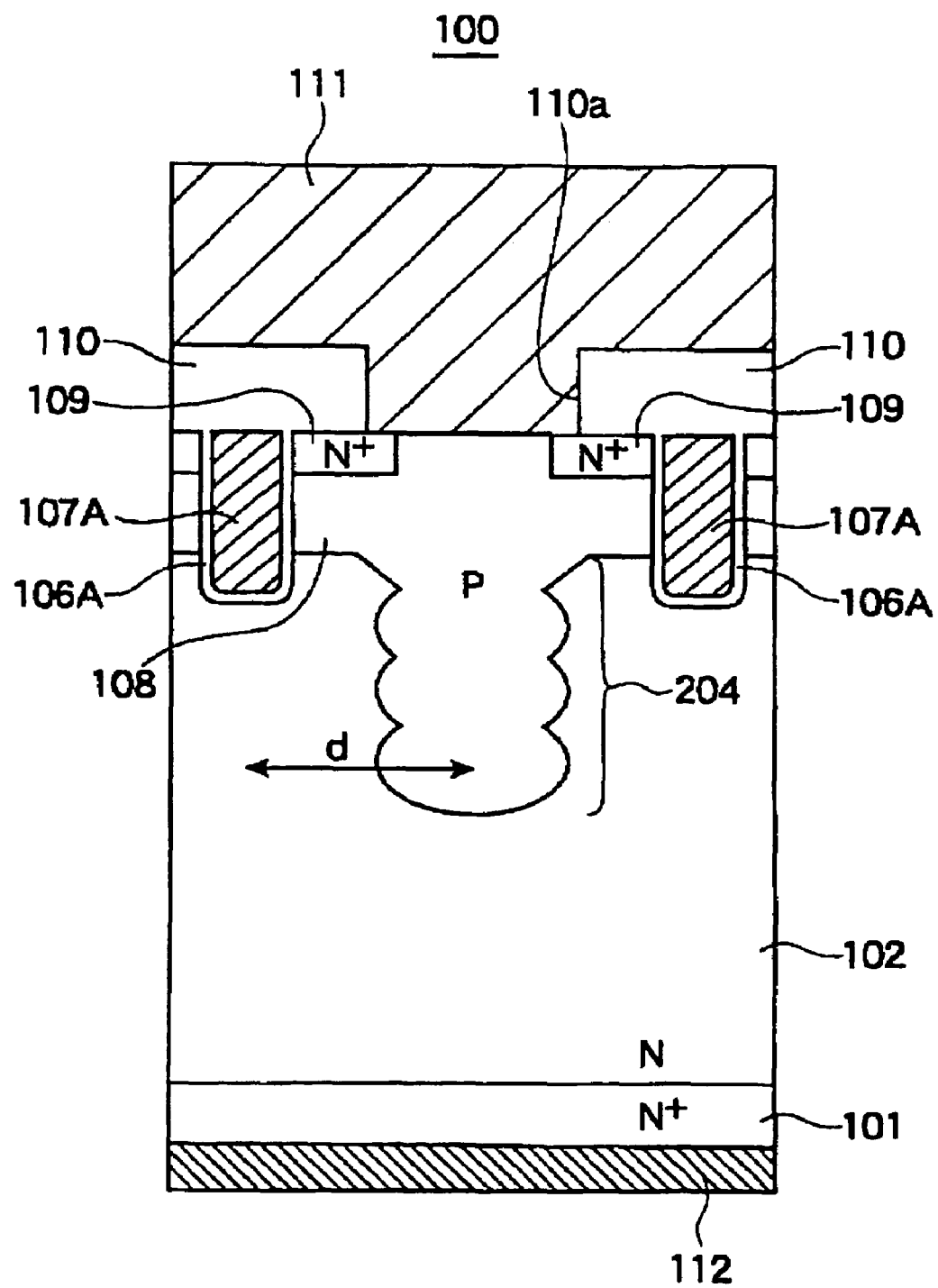
FIG. 17 is a cross sectional view showing the semiconductor apparatus of the related art.

A solid line of FIG. 15 shows a relationship between an electric field intensity E and the depth Z when the reverse bias voltage is applied. A dashed line of FIG. 15 shows a relationship between an accepter concentration NA and the depth Z when the reverse bias voltage is applied.

In FIG. 15, Z3 corresponds to the boundary between the first portion 43 and the second portion 44, and Z4 corresponds to the bottom of the first portion 43. As shown in FIG. 15, the electric field intensity E has two peaks at Z3 and Z4. The electric field intensity of Z3 is higher than that of Z4.

Therefore, the electric field intensity is partly increased when the reverse bias voltage is applied. The avalanche breakdown occurs preferentially in the column region 40. The avalanche current produced in the column region 40 directly flows to the source contact via the base region 108. The avalanche current is not concentrated near the gate electrode 107A. The gate oxide layer 106A is not damaged.

A condition to form the column region 40 is described below. FIG. 16 shows a table of a dose amount of the column region 40, withstand voltage characteristics and a withstand voltage definition point of the second embodiment.

Row A of the table shown in FIG. 16 corresponds to that the second portion 44 is the high impurity concentration portion. The dose amount of the second portion is $4*10^{12}$ atoms/cm$^2$, and the dose amount of the other portions (the first portion 43, the third portion 45 and the fourth portion 46) are $2*10^{12}$ atoms/cm$^2$. The impurity concentration of high impurity concentration portion becomes $8*10^{16}$ cm$^{-3}$.

Row B of the table corresponds to that the third portion 45 is the high impurity concentration portion. The dose amount of the third portion 45 is $4*10^{12}$ atoms/cm$^2$, and the dose amount of the other portions (the first portion 43, the second portion 44 and the fourth portion 46) are $2*10^{12}$ atoms/cm$^2$. The impurity concentration of high impurity concentration portion becomes $8*10^{16}$ cm$^{-3}$.

Row C of the table corresponds to that the first portion 43 is the high impurity concentration portion. The dose amount of the first portion 43 is $4*10^{12}$ atoms/cm$^2$, and the dose amount of the other portions (the second portion 44, the third portion 45 and the fourth portion 46) are $2*10^{12}$ atoms/cm$^2$. If the first portion 43 has the higher impurity concentration than the other portions, the bottom of the column region 40 has the higher impurity concentration portion. The impurity concentration of high impurity concentration portion becomes $8*10^{16}$ cm$^{-3}$.

Row D of the table corresponds to that the high impurity concentration portion is not formed. The dose amounts of four portions (the first portion 43, the second portion 44, the third portion 45 and the fourth portion 46) are the same; for example, the dose amount of each portion is $2*10^{12}$ atoms/cm$^2$. The average impurity concentration of the column region 4 is $4*10^{16}$ cm$^{-3}$ in the example shown in row D.

In the semiconductor device shown in the table of FIG. 16, the size of the cell is 4 um, and the width of the opening portion 113a is 1 um. The opening portion 113a is formed in the oxide layer 113 to form the column region 40. The whole dose amount of the column region is $1.2*10^{13}$ cm$^{-2}$.

As shown in the table of FIG. 16, four times of ion implantation is carried out. The energy of the first ion implantation is 1500 KeV. The first ion implantation forms the first portion 43. The energy of the second ion implantation is 1000 KeV. The second ion implantation forms the second portion 44. The energy of the third ion implantation is 500 KeV. The third ion implantation forms the third portion 45. The energy of the fourth ion implantation is 200 KeV. The fourth ion implantation forms the fourth divided portion 46. The bottom of the column region 40 is formed in 3 um depth.

The withstand voltage of the semiconductor device is 69V when the second portion 43 is the high impurity concentration portion. The withstand voltage of the semiconductor device is 73V when the third portion 43 is the high impurity concentration portion. The withstand voltage of the semiconductor device is 76V when the first portion 43 is the high impurity concentration portion. The withstand voltage is the substantially the same as when the high impurity concentration portion is not formed.

As shown in FIG. 16, the withstand voltage definition point is located in the column region 40 when the high impurity concentration portion is formed. More precisely, the withstand voltage definition point is located at the bottom of the high impurity concentration portion. Therefore, the avalanche current flows in the column region 40, and the gate oxide layer 106A is not damaged.

In the examples shown in row A, B and C of FIG. 16, even if a repetitive avalanche switching test of high temperature (150 degree centigrade) is carried out, there is little influence on the gate oxide layer, and the gate oxide capacitance versus voltage characteristics is not shifted.

On the other hand, when the high impurity concentration portion is not formed, the withstand voltage definition point is located at the bottom of the trench gate. Therefore, the avalanche current flows near the gate oxide layer 106A, and the gate oxide layer 106A may be damaged because of the avalanche current.

According to the semiconductor apparatus 2 of the second embodiment, the semiconductor apparatus 2 has a SJ structure which has the column region 4 formed in the drift region 102 under the base region 108. The trade-off between the break down voltage and the on-resistance is improved. That is, the withstand voltage characteristics is not degraded, and the on-resistance can be reduced.

The high impurity concentration portion is formed in this embodiment. Therefore, the electric field intensity is increased partly when the reverse bias voltage is applied. The avalanche breakdown occurs preferentially in the column region 40. The avalanche current produced in the column region 40 directly flows to the source contact via the base region 108. The avalanche current is not concentrated near the gate electrode 107A (that is, a portion along the trench 104 of the base region 108). The damage to the gate oxide layer 106A can be avoided.

The bottom of the high impurity concentration portion is deeper than the bottom of the gate electrode 107A. When the reverse bias voltage is applied to the semiconductor apparatus 2, the portion where the electric field intensity is partly increased is apart form the bottom of the trench 104. The avalanche current which flows in the column region 4 does not flow to near the gate electrode 107A.

In the second embodiment, only one high impurity concentration portion is formed. A plurality of high impurity concentration portions, however, may be formed.

Further, it is possible to combine the first embodiment with the second embodiment. The column region is divided into a plurality of divided portions, and one of the divided portions may be a high impurity concentration portion. For example, the lower part 421 of the second divided portion 42 (please refer to FIG. 1) may be the high impurity concentration region. In this case, a dose amount of boron of the lower part 422 is larger than that of the upper part 422.

Further, the trench 103 shown in FIG. 13 may be formed in the second embodiment.

An N type MOSFET is described in the above embodiments. Even if the conductivity type is reversed, the embodiments are available by changing the conductive type of each region.

As shown in FIG. 10 and FIG. 16, the slight differences of the withstand voltages are shown between the embodiments and the conventional power MOSFET. The slight differences are minute compared with the improvements of the withstand voltage and on-resistance caused by the SJ structure.

It is apparent that the present invention is not limited to the above embodiment, that may be modified and changed without departing from the scope and spirit of the invention.

What is claimed is:

1. A semiconductor apparatus comprising:
a gate electrode;
a gate insulating layer;
a drift region of a first conductivity type formed over a semiconductor substrate of the first conductivity type;
a base region of a second conductivity type formed over the drift region;
a source region of the first conductivity type formed on the base region; and
a column region formed in the drift region directly under the base region, the column region being divided into a plurality of discrete portions in a depth direction, said plurality of discrete portions having a same conductivity type, a first one of said plurality of discrete portions being directly connected to said base region and being below a bottom of said gate electrode,
wherein at least a bottom part of one of the discrete portions has an impurity concentration that is at least twice an impurity concentration of an average impurity concentration of the column region.

2. The semiconductor apparatus according to claim 1, wherein the gate electrode extends from the base region to the drift region, the gate electrode is formed in a first trench formed in the base region and a part of the drift region.

3. The semiconductor apparatus according to claim 2, further comprising:
a second trench formed in the base region; and
wherein the column region is formed directly beneath said second trench.

4. The semiconductor apparatus according to claim 2, wherein a bottom of the first discrete portion is deeper than a bottom of the first trench.

5. The semiconductor apparatus according to claim 4, wherein the bottom of the first discrete portion has at least twice an impurity concentration of an average impurity concentration of the column region.

6. A semiconductor apparatus comprising:
   a gate electrode;
   a gate insulating layer;
   a drift region of a first conductivity type formed over a semiconductor substrate of the first conductivity type;
   a base region of a second conductivity type formed over the drift region;
   a source region of the first conductivity type formed on the base region; and
   a column region formed in the drift region under the base region, the column region being divided into a plurality of divided portions in a depth direction,
   wherein at least a bottom part of one of the discrete portions has at least twice an impurity concentration of an average impurity concentration of the discrete portions.

7. The semiconductor apparatus according to claim 6, further comprising:
   a first trench formed in the base region; and
   wherein the gate electrode and the gate insulating layer are formed in the first trench.

8. The semiconductor apparatus according to claim 7, further comprising:
   a second trench formed in the base region; and
   wherein the column region is formed directly beneath said second trench.

9. A semiconductor apparatus, comprising:
   a semiconductor substrate;
   a drift region of a first conductivity type formed over said semiconductor substrate;
   a base region of a second conductivity type formed over said drift region;
   a source region of the first conductivity type formed on said base region;
   a first trench formed in said base region and having a gate electrode and a gate insulating layer in said first trench; and
   a column region formed in said drift region directly under said base region, said column region having a first portion directly connected to said base region and a second portion which is discrete from said first portion in a depth direction, said first and second portions having a same conductivity type, a bottom of said first portion being lower than a bottom of said gate electrode,
   wherein at least a bottom part of one of said first and second portions has an impurity concentration which is equal to or more than twice an impurity concentration of an average impurity concentration of the column region.

10. The semiconductor apparatus according to claim 9, further comprising:
    a second trench formed in the base region; and
    wherein the column region is formed directly beneath said second trench.

11. The semiconductor apparatus according to claim 9, wherein said bottom portion of said first portion has at least twice an impurity concentration of said average impurity concentration of said column region.

* * * * *